United States Patent
Lee et al.

(10) Patent No.: US 12,144,115 B2
(45) Date of Patent: Nov. 12, 2024

(54) ELECTRONIC DEVICE INCLUDING THERMOSETTING BONDING SHEET

(71) Applicant: SAMSUNG ELECTRONICS CO., LTD., Suwon-si (KR)

(72) Inventors: Youngsun Lee, Suwon-si (KR); Dohyeon Kim, Suwon-si (KR); Byeongkeol Kim, Suwon-si (KR); Jinsu Kim, Suwon-si (KR); Seokjoon Park, Suwon-si (KR); Jungje Bang, Suwon-si (KR); Hoyeon Seo, Suwon-si (KR); Jongbum Lee, Suwon-si (KR); Jongmin Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 18/084,994

(22) Filed: Dec. 20, 2022

(65) Prior Publication Data
US 2023/0119170 A1   Apr. 20, 2023

Related U.S. Application Data

(63) Continuation of application No. PCT/KR2022/014286, filed on Sep. 23, 2022.

(30) Foreign Application Priority Data

Sep. 30, 2021   (KR) .................. 10-2021-0130028

(51) Int. Cl.
*H05K 1/14*   (2006.01)
*B32B 3/26*   (2006.01)
*B32B 7/12*   (2006.01)

(52) U.S. Cl.
CPC ............. *H05K 1/141* (2013.01); *B32B 3/266* (2013.01); *B32B 7/12* (2013.01); *B32B 2457/00* (2013.01);
(Continued)

(58) Field of Classification Search
CPC .................. H05K 1/141; H05K 1/111; H05K 2201/10977; H05K 2201/10984; H05K 2201/10378; H05K 2201/048
See application file for complete search history.

(56) References Cited

U.S. PATENT DOCUMENTS 9,040,837 B2   5/2015   Takahashi et al.
2001/0001593 A1   5/2001   Armezzani et al.
(Continued)

FOREIGN PATENT DOCUMENTS

EP   2056655   5/2009
JP   5012514   8/2012
(Continued)

OTHER PUBLICATIONS

Search Report dated Jan. 5, 2023 issued in International Patent Application No. PCT/KR2022/014286.
(Continued)

*Primary Examiner* — Paresh Paghadal
(74) *Attorney, Agent, or Firm* — Nixon & Vanderhye, P.C.

(57) ABSTRACT

An electronic device including a thermosetting bonding sheet may include: a base substrate including a base substrate body and a plurality of base pads disposed on the base substrate body, a connection substrate including a connection substrate body facing the base substrate body, a plurality of connection pads disposed on the connection substrate body and including a pad hole, and a plurality of connection lines disposed on the connection substrate body and connected to the plurality of connection pads, a solder, at least a portion of which is inserted into the pad hole, disposed on the base pad and configured to electrically connect the base pad to the connection pad, and a thermosetting bonding sheet provided between the base substrate body and the
(Continued)

connection substrate body, bonded to the base substrate body and the connection substrate body, and enclosing the solder.

20 Claims, 6 Drawing Sheets

(52) U.S. Cl.
CPC ............... *H05K 2201/048* (2013.01); *H05K 2201/10378* (2013.01); *H05K 2201/10984* (2013.01)

(56) References Cited

U.S. PATENT DOCUMENTS

| | | | | |
|---|---|---|---|---|
| 2002/0084536 A1* | 7/2002 | Sundahl | ............... | H05K 3/4629 257/784 |
| 2002/0093104 A1* | 7/2002 | Goldmann | ............ | H01L 24/29 257/E23.067 |
| 2008/0066945 A1* | 3/2008 | Hwan | ............... | H01L 21/563 257/E21.503 |
| 2011/0249417 A1* | 10/2011 | Kawabata | .............. | H05K 3/323 174/259 |
| 2012/0325533 A1* | 12/2012 | Yoshimura | ........... | H05K 3/4623 174/258 |
| 2013/0244490 A1 | 9/2013 | Rathburn | | |
| 2020/0306979 A1 | 10/2020 | Paulson et al. | | |
| 2020/0344881 A1 | 10/2020 | Tonaru et al. | | |
| 2021/0100097 A1 | 4/2021 | Mieda et al. | | |

FOREIGN PATENT DOCUMENTS

| | | |
|---|---|---|
| KR | 10-2013-0033849 | 4/2013 |
| KR | 10-2014-0055918 | 5/2014 |
| KR | 10-1509019 | 4/2015 |
| KR | 10-2016-0086181 | 7/2016 |
| KR | 10-1829316 | 2/2018 |
| KR | 10-2018-0024099 | 3/2018 |

OTHER PUBLICATIONS

Extended European Search Report dated Sep. 20, 2024 issued in European Patent Application No. 22876762.0.

* cited by examiner

ELECTRONIC DEVICE INCLUDING THERMOSETTING BONDING SHEET

CROSS-REFERENCE TO RELATED APPLICATIONS

This application is a continuation of International Application No. PCT/KR2022/014286 designating the United States, filed on Sep. 23, 2022, in the Korean Intellectual Property Receiving Office and claiming priority to Korean Patent Application No. 10-2021-0130028, filed on Sep. 30, 2021, in the Korean Intellectual Property Office, the disclosures of which are incorporated by reference herein in their entireties.

BACKGROUND

1. Field

The disclosure relates to an electronic device including a thermosetting bonding sheet.

2. Description of Related Art

An electronic device includes a plurality of circuit boards and a plurality of components. The plurality of components may be disposed on a circuit board. The plurality of circuit boards may bond to each other. Some of the plurality of circuit boards may be used to support the plurality of components, and some of the plurality circuit boards may assist the plurality of components to transmit and receive signals between one another.

Two adjacent substrates of a plurality of substrates may bond to each other. For example, the two adjacent substrates may bond through a hot-bar method. For example, a first substrate may be provided with a bonding pad and a solder physically and electrically connected to a second substrate may be arranged on the bonding pad. The solder may be provided in a solid state initially when the solder is arranged on the bonding pad of the first substrate. The solder may temporarily melt by receiving heat by the hot-bar and may be connected to another substrate. When the solder is in a melted state, a technique for preventing the solder from contacting other wirings provided on the second substrate may be required.

There is a fine pitch hot-bar method among the hot-bar methods. The fine pitch hot-bar method may prevent a short between the solder and the wirings by designing a bonding pad provided on the first substrate to have a circular shape and covering the wirings on the second substrate with a photo solder resist (hereinafter, referred to as the PSR).

Depending on a PSR processing capability, a short defect may occur. For example, a short may occur due to a difference in PSR thicknesses.

SUMMARY

Embodiments of the disclosure provide an electronic device including a thermosetting bonding sheet that may bond two adjacent substrates in a simple method and may simultaneously implement a short prevention/reduction function of the solder and the wirings and a bonding function using the thermosetting bonding sheet.

According to various example embodiments, an electronic device including a thermosetting bonding sheet may include: a base substrate including a base substrate body and a plurality of base pads disposed on the base substrate body, a connection substrate including a connection substrate body facing the base substrate body, a plurality of connection pads disposed on the connection substrate body and including a pad hole, and a plurality of connection lines disposed on the connection substrate body and respectively connected to the plurality of connection pads, a solder, at least a portion of which is inserted into the pad hole, disposed on the base pad and configured to electrically connect the base pad to the connection pad, and a thermosetting bonding sheet provided between the base substrate body and the connection substrate body, bonded to the base substrate body and the connection substrate body, and enclosing the solder.

According to various example embodiments, an electronic device including a thermosetting bonding sheet may include: a base substrate including a base substrate body and a plurality of base pads disposed on the base substrate body, a solder disposed on the base pad, and a thermosetting bonding sheet including a sheet base arranged on the base substrate body and a plurality sheet holes penetrating the sheet base and accommodating the base pad and the solder.

According to various example embodiments, an electronic device including a thermosetting bonding sheet may include: a base substrate including a base substrate body and a plurality of base pads disposed on the base substrate body, a connection substrate including a connection substrate body facing the base substrate body, a plurality of connection pads disposed on the connection substrate body and including a pad hole, and a plurality of connection lines disposed on the connection substrate body and respectively connected to the plurality of connection pads, a solder, at least a portion of which is inserted into the pad hole, disposed on the base pad and configured to electrically connect the base pad to the connection pad, and a thermosetting bonding sheet provided between the base substrate body and the connection substrate body, bonded to the base substrate body and the connection substrate body, and attached to the base pad, the connection pad, the solder, and the connection line.

According to various example embodiments, the electronic device including the thermosetting bonding sheet may bond two adjacent substrates by a simple method and may simultaneously implement a short prevention/reduction function of the solder and the wiring and a bonding function of the substrate using the thermosetting bonding sheet.

According to various example embodiments, the electronic device including the thermosetting bonding sheet may bond the substrate and may prevent and/or reduce a short through the thermosetting bonding sheet without performing a process of applying a PSR to the substrate, exposing the PSR, and developing the PSR.

According to various example embodiments, the electronic device including the thermosetting bonding sheet may improve an adhesive force of an adhesion portion. For example, the electronic device may secure an adhesive force of 2 to 3 kgF.

According to various example embodiments, the electronic device including the thermosetting bonding sheet may be waterproof around the adhesion portion of the bonding sheet. For example, the electronic device may be sufficiently waterproof without including a separate waterproof member.

According to various example embodiments, the electronic device including the thermosetting bonding sheet may relatively increase a flexible area of the substrate since the electronic device employs a structure for bonding the substrate through the bonding sheet.

In addition, various effects directly or indirectly ascertained through the present disclosure may be provided.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
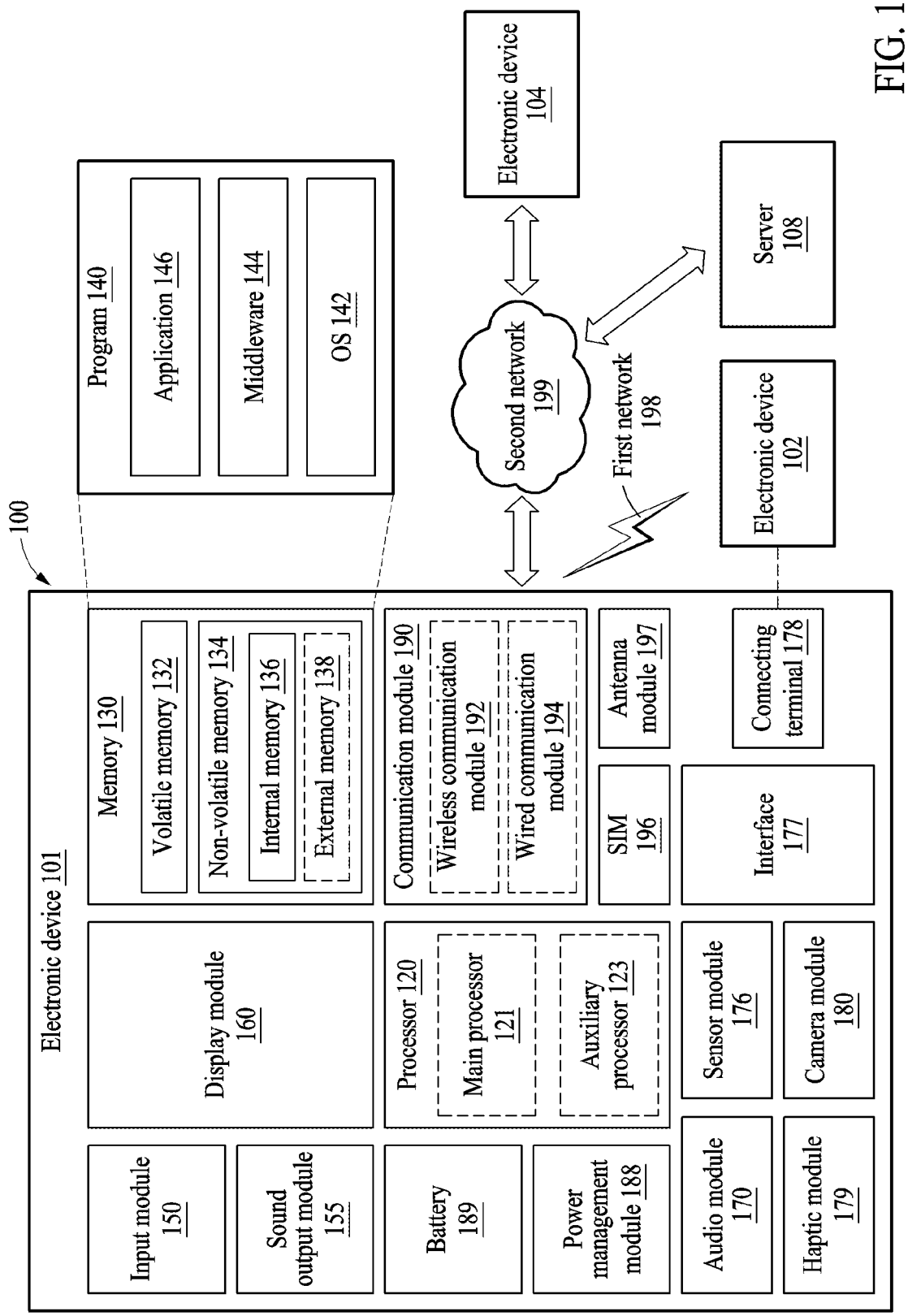
FIG. 1 is a block diagram illustrating an example electronic device in a network environment according to various embodiments.

Hereinafter, various example embodiments will be described in greater detail with reference to the accompanying drawings. When describing the example embodiments with reference to the accompanying drawings, like reference numerals refer to like elements and a repeated description related thereto may not be provided.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation.

According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197. According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, a home appliance device, or the like. According to an example embodiment of the disclosure, the electronic device is not limited to those described above.

It should be appreciated that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
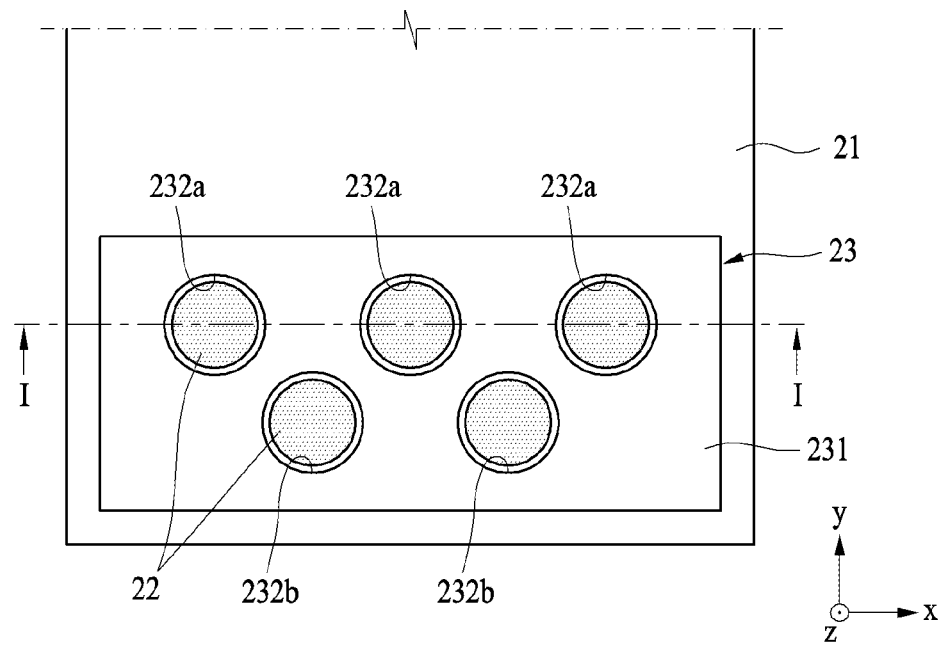
FIG. 2A is a diagram illustrating a base substrate, a solder, and a thermosetting bonding sheet according to various embodiments.
Figure 2B:
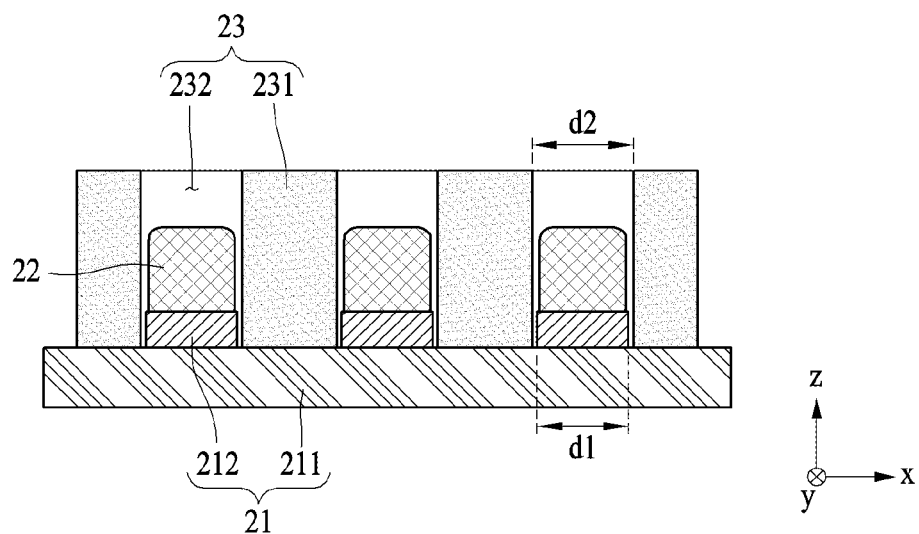
FIG. 2B is a cross-sectional view taken along a line I-I of FIG. 2A according to various embodiments.
Figure 2C:
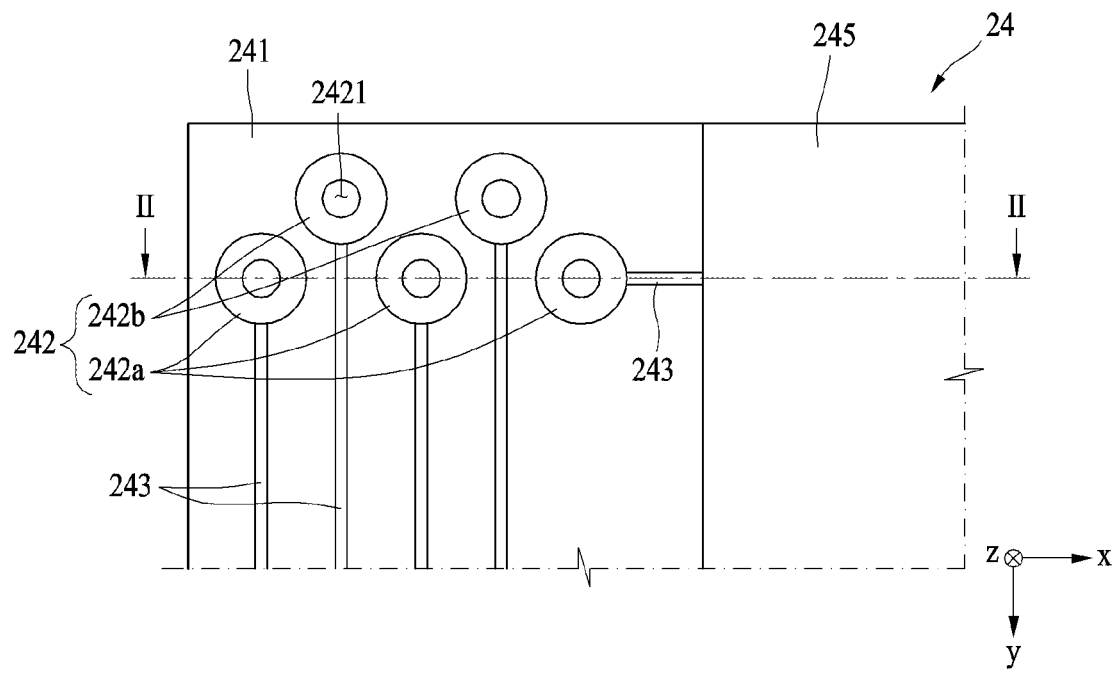
FIG. 2C is a diagram illustrating a bottom view of a connection substrate according to various embodiments.
Figure 2D:
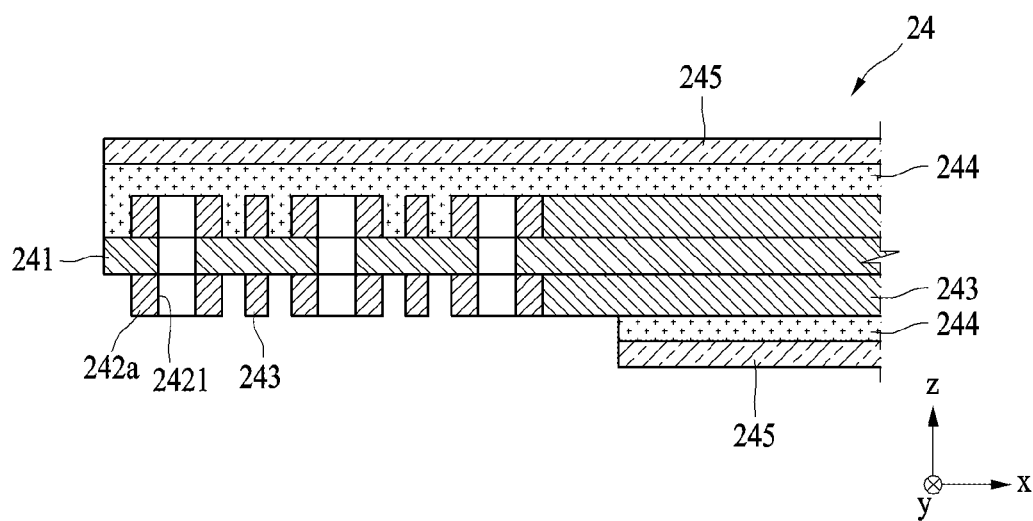
FIG. 2D is a cross-sectional view of the connection substrate taken along a line II-II of FIG. 2C according to various embodiments.

FIG. 2A is a diagram illustrating a plan view of a base substrate, a solder, and a thermosetting bonding sheet according to various embodiments. FIG. 2B is a cross-sectional view taken along a line I-I of FIG. 2A, according to various embodiments. FIG. 2C is a diagram illustrating a bottom view of a connection substrate according to various embodiments. FIG. 2D is a cross-sectional view of the connection substrate taken along a line II-II of FIG. 2C according to various embodiments.

Referring to FIGS. 2A, 2B, 2C and 2D (which may be referred to as FIGS. 2A to 2D), an electronic device (e.g., the electronic device 101 of FIG. 1) may include a base substrate 21, a solder 22, a thermosetting bonding sheet 23, and a connection substrate 24.

In an example embodiment, the base substrate 21 may face the connection substrate 24. For example, the base substrate 21 may have a flat plate shape. For example, the base substrate 21 is not limited to a rigid PCB and may be a flexible PCB (FPCB). Hereinafter, a description of the base substrate 21 is provided based on that a normal direction is the z-axis direction. The base substrate 21 may include a base substrate body 211 and a plurality of base pads 212 arranged on the base substrate body 211.

In an example embodiment, the solder 22 may be disposed on each of the plurality of base pads 212. The base pad 212 may be formed by metal plating. The number of plurality of base pads 212 may be the same as the number of solders 22. The plurality of base pads 212 may protrude from the base substrate body 211 in the z-axis direction and may be parallel with the surface of the base substrate body 211, although not shown in the drawings. The shape of the plurality of base pads 212 is illustrated as a cylindrical shape. However, the shape is not limited thereto.

In an example embodiment, the plurality of base pads 212 may configure a plurality of rows. For example, the plurality of base pads 212 may include first base pads aligned with each other in the x-axis direction and spaced apart from each other and second base pads provided at a location apart from the first base pads in the -y direction. The first base pads and the second base pads may not be aligned with each other and may be misaligned with each other in the y-axis direction. The first base pads and the second base pads may be alternately disposed in the x-axis direction. Although five base pads 212 are illustrated, the number of base pads 212 is not limited thereto.

In an example embodiment, the solder 22 may be disposed on the base pad 212. The solder 22 may be disposed in a solid state on the base pad 212. When heat is applied to the solder 22, the solder 22 may temporarily melt into a liquid state and may be connected to a connection pad 242, described below.

In an example embodiment, the thermosetting bonding sheet 23 (hereinafter, referred to as the bonding sheet) may bond to the base substrate 21 and the connection substrate 24. The bonding sheet 23 may be softened to be deformable by receiving heat through a hot-bar method. When the bonding sheet 23 cools, the bonding sheet 23 may harden such that the bonding sheet 23 may not deform again. The bonding sheet 23 in a deformed state by applying heat thereto may bond to the base substrate 21 and the connection substrate 24 by attaching to the base substrate 21 and the connection substrate 24 and hardening.

In an example embodiment, the bonding sheet 23 may prevent and/or reduce the solder 22 from flowing in an unintended direction. The bonding sheet 23 may enclose the solder 22. While the bonding sheet 23 undergoes thermal deformation by receiving heat, the solder 22 may melt, and in this case, the bonding sheet 23 may support the solder 22 such that the solder 22 does not flow to the outside of the base pad 212.

In an example embodiment, based on a state before thermal deformation of the bonding sheet 23, the height (e.g., the length in the z-axis direction) may be greater than a sum of the height of the base pad 212 and the height of the solder 22. According to the shape described above, when the bonding sheet 23 is disposed on the base substrate 21, the solder 22 may be completely covered by the bonding sheet 23 and while the solder 22 is melting, a phenomenon in which at least a portion of the solder 22 flows along the upper surface of the bonding sheet 23 may be prevented and/or reduced.

In an example embodiment, the bonding sheet 23 may include a sheet base 231 disposed on the base substrate body 211 and a plurality of sheet holes 232 penetrating the sheet base 231. The plurality of sheet holes 232 may be formed, for example, through drilling. The plurality of sheet holes 232 may include a first sheet hole 232a accommodating the first base pads aligned in the x-axis direction and a second sheet hole 232b accommodating the second base pads apart from the first base pads in the y-axis direction.

In an example embodiment, a diameter d1 of the base pad 212 may be less than a diameter d2 of the sheet hole 232. According to the shape described above, one may easily dispose the bonding sheet 23 on the base substrate 21 without a process of deforming the bonding sheet 23.

In an example embodiment, the connection substrate 24 may have a flat plate shape. For example, the connection substrate 24 may be a FPCB. The connection substrate 24 may include a connection substrate body 241, a plurality of connection pads 242 disposed on the connection substrate body 241, a plurality of connection lines 243 connected to the plurality of connection pads 242 and disposed on the connection substrate body 241, an adhesive layer 244 configured to cover the connection substrate body 241, and a cover layer 245 connected to the connection substrate body 241 by the adhesive layer 244.

In an example embodiment, the connection substrate body 241 may face the base substrate body 211. The connection substrate body 241 may include a body hole communicating with a pad hole 2421 of the connection pad 242.

In an example embodiment, the plurality of connection pads 242 may be disposed on the connection substrate body 241 and may include the pad hole 2421 in the central portion thereof. The pad hole 2421 may accommodate at least a portion of the solder 22. The pad hole 2421 may communicate with the body hole. The plurality of connection pads 242 may include a plurality of first connection pads 242a respectively facing the first base pads and a plurality of second connection pads 242b respectively facing the second base pads. The plurality of connection pads 242 may be provided in a pair opposite to each other based on the connection substrate body 241.

In an example embodiment, the plurality of connection lines 243 may be connected to the plurality of connection pads 242. One end of the plurality of connection lines 243 may be fixed to the connection pad 242, and the plurality of connection lines 243 may have a shape extending in one direction. The plurality of connection lines 243 may transmit a signal provided to the connection pad 242 to the outside. Some of the connection lines 243 may have different longitudinal directions from the other connection lines 243. For example, as shown in the drawings, longitudinal directions of most of the connection lines 243 may be in the y-axis direction. However, the longitudinal direction of the connection line 243 shown on the rightmost side of FIG. 2C may be in the x-axis direction. The number of the plurality of connection lines 243 may be the same as the number of connection pads 242. For example, when a pair of connection pads 242 is provided opposite to each other based on the connection substrate body 241, a pair of connection lines 243 may be provided opposite to each other based on the connection substrate body 241.

In an example embodiment, the adhesive layer 244 may connect the connection substrate body 241 to the cover layer 245. The cover layer 245 may cover at least a portion of the connection substrate body 241.

Figure 3A:
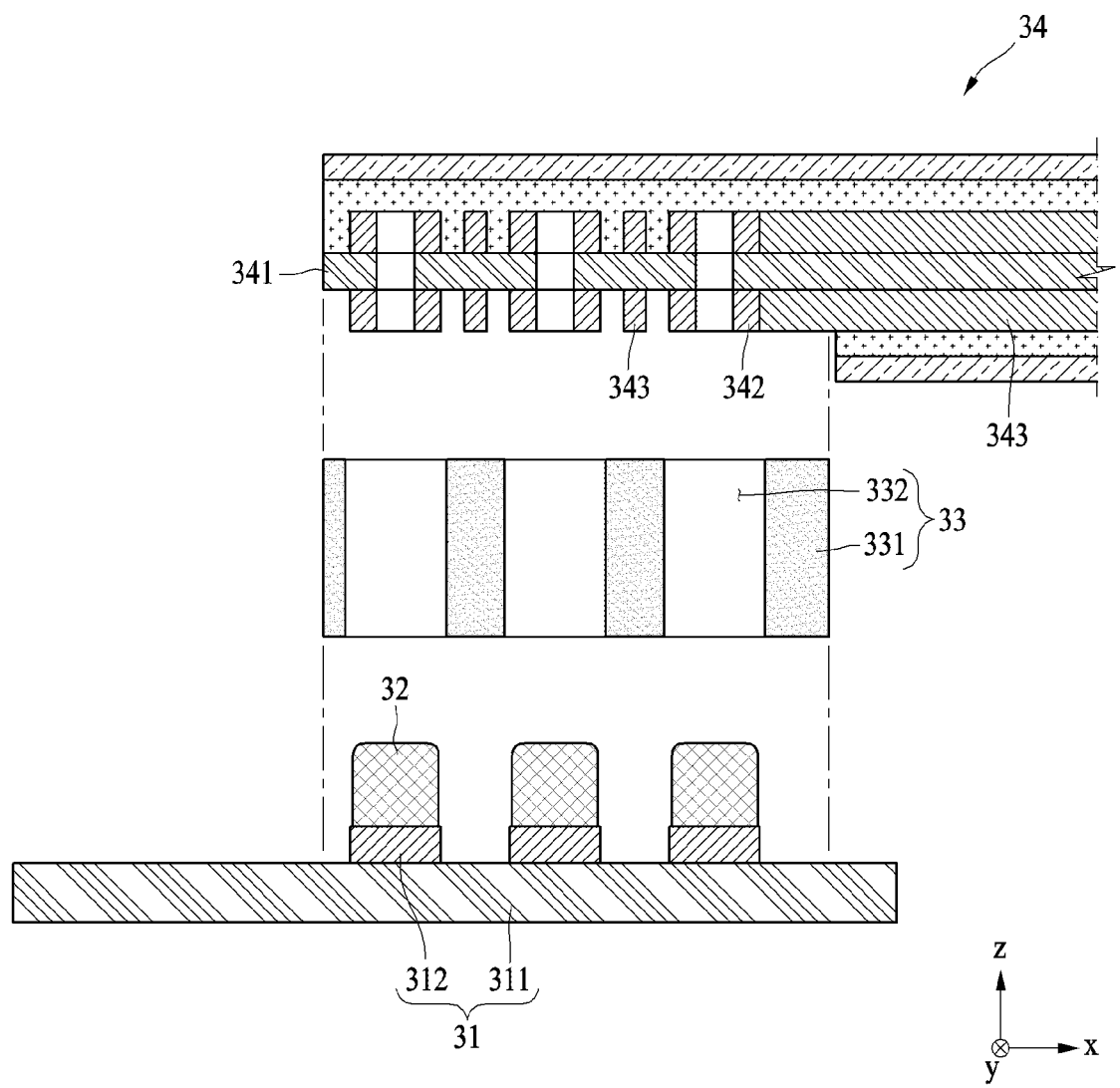
FIG. 3A is a cross-sectional view illustrating a state before an electronic device is assembled, according to various embodiments.
Figure 3B:
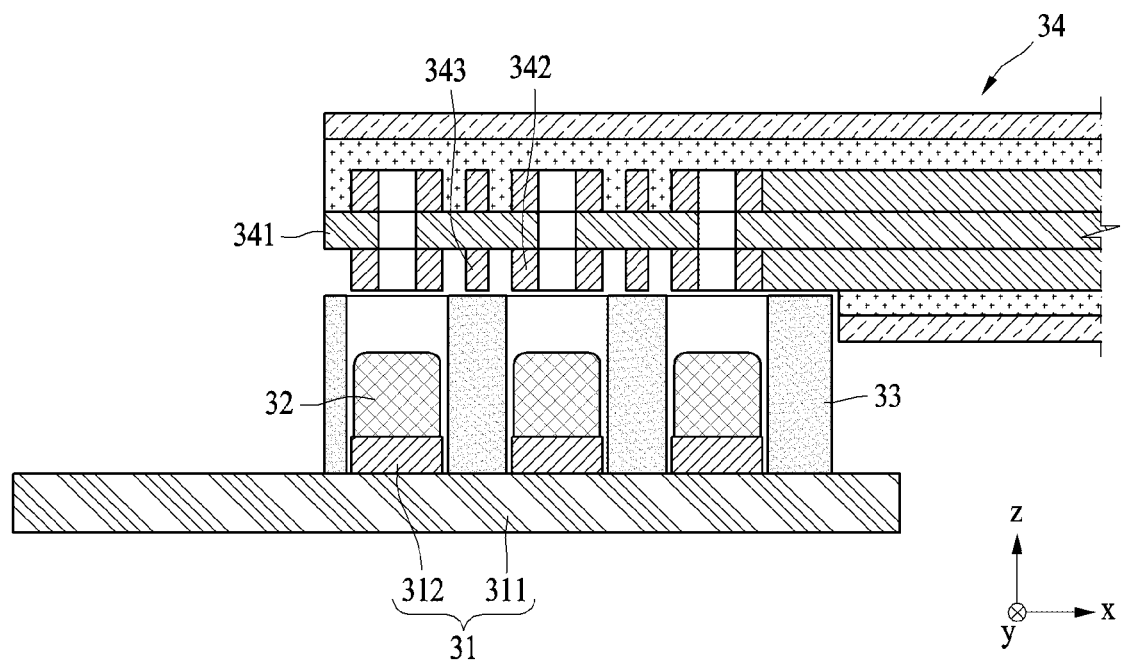
FIG. 3B is a cross-sectional view illustrating a state in which a thermosetting bonding sheet is arranged on a base substrate body, according to various embodiments.
Figure 3C:
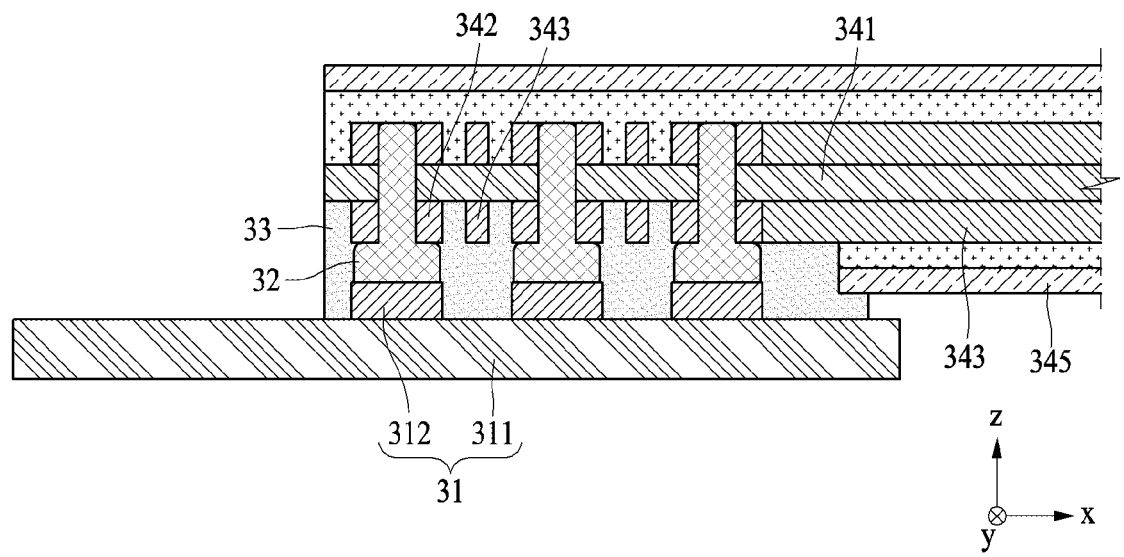
FIG. 3C is a cross-sectional view illustrating a state in which the thermosetting bonding sheet is bonded to a base substrate and a connection substrate by thermal deformation, according to various embodiments.

FIG. 3A is a cross-sectional view illustrating a state before an electronic device is assembled, according to an various embodiments. FIG. 3B is a cross-sectional view illustrating a state in which a thermosetting bonding sheet is arranged on a base substrate body, according to various embodiments. FIG. 3C is a cross-sectional view illustrating a state in which the thermosetting bonding sheet is bonded to a base substrate and a connection substrate by thermal deformation, according to various embodiments.

Referring to FIGS. 3A, 3B and 3C (which may be referred to as FIGS. 3A to 3C), a bonding sheet 33 may be disposed on a base substrate 31. A sheet base 331 may be in surface contact with a base substrate body 311. A plurality of sheet holes 332 may enclose a base pad 312 and a solder 32.

In an example embodiment, when a connection substrate 34 is placed on the upper side of the bonding sheet 33, heat may apply to the bonding sheet 33 and the solder 32. For example, heat may be transferred by a hot-bar method. A portion of the upper side of the solder 32 may enter inside a connection pad 342 as the solder 32 melts. The bonding sheet 33 may prevent and/or reduce a portion of the lower side of the solder 32 from flowing out to the base pad 312. For example, the bonding sheet 33 may receive a force about 20 kgF in one minute and may be deformed at 150 degrees. For example, a temperature of hot-bar may be 200 to 350 degrees. An adhesive force of the bonding sheet 33 may be 1.5 kgF/10 mm2 to 2.5 kgF/10 mm2.

In an example embodiment, the bonding sheet 33 may be attached to the base pad 312. As the bonding sheet 33 is attached to the base pad 312, the solder 32 may be prevented and/or reduced from flowing to the outside of the base pad 312. Since the solder 32 is prevented/reduced from entering the base substrate body 311, an unintentional short may be prevented and/or reduced.

In an example embodiment, the bonding sheet 33 may be attached to the side portion of the solder 32. According to the structure described above, by supporting the edge of the solder 32, the bonding sheet 33 may assist the solder 32 to elevate in the +z direction as the solder 32 intends and may assist the solder 32 to enter inside a pad hole of the connection pad 342.

In an example embodiment, the bonding sheet 33 may fill a space between the connection pad 342 and the connection line 343 by entering the space. The bonding sheet 33 may be attached to the connection pad 342 and the connection line 343. According to the structure described above, since the bonding sheet 33 prevents and/or reduces leakage of the solder 32, the connection pad 342 and the connection line 343 may be prevented/reduced from being short-circuited by the solder 32.

In an example embodiment, the connection line 343 may be completely covered by the connection substrate body 341 and the bonding sheet 33 in the portion where the bonding sheet 33 is provided, in other words, in the portion in the −z direction based on the connection substrate body 341. For example, based on an assumption that the cross-section of the connection line 343 is a rectangular shape, the upper surface (e.g., the surface in the +z direction) of the connection line 343 may be covered by the connection substrate body 341 and the other surfaces of the connection line 343 may be covered by the bonding sheet 33.

In an example embodiment, the edge of the bonding sheet 33 may outwardly extend as the bonding sheet 33 is compressed by the base substrate 31 and the connection substrate 34. A portion of the edge of the bonding sheet 33 may bond to the base substrate body 311 and a cover layer 345. According to the structure describe above, the electronic device may implement a sealing function with the bonding sheet 33 without including a separate sealing member to prevent and/or reduce water or a foreign material from entering between the cover layer 345 and the base substrate body 311.

In an example embodiment, the bonding sheet 33 may guide the solder 32 and may prevent and/or reduce a short by covering the connection line 343 while bonding the base substrate 31 to the connection substrate 34.

In an example embodiment, based on a state before thermal deformation of the bonding sheet 33, the height of the bonding sheet 33 may be greater than a sum of the height of solder 32 and the height of the base pad 312. On the other hand, based on a state in which the bonding sheet 33 is bonded to the base substrate 31 and the connection substrate 34 through thermal deformation, the height of the bonding sheet 33 may be less than the sum of the height of the solder 32 and the height of the base pad 312.

In an example embodiment, a pair of connection pads 342 may be provided on opposite sides based on the connection substrate body 341 and the solder 32 may be provided inside a body hole of the connection substrate body 341 and a pad hole of the pair of connection pads 342.

In an example embodiment, the electronic device may be manufactured through a process of implementing a circuit of a PCB, stacking the cover layer 345, processing the bonding sheet 33, placing the solder 32 on the base pad 312 of the PCB, and performing hot-bar bonding. For example, an operation of processing the bonding sheet 33 may include an operation of cutting the bonding sheet 33 into an appropriate size and processing the sheet hole 332 on the bonding sheet 33 by, for example, drilling. The order of operations of processing the bonding sheet 33 is not limited. For example, before stacking the cover layer 345, the bonding sheet 33 may be processed.

Figure 4:
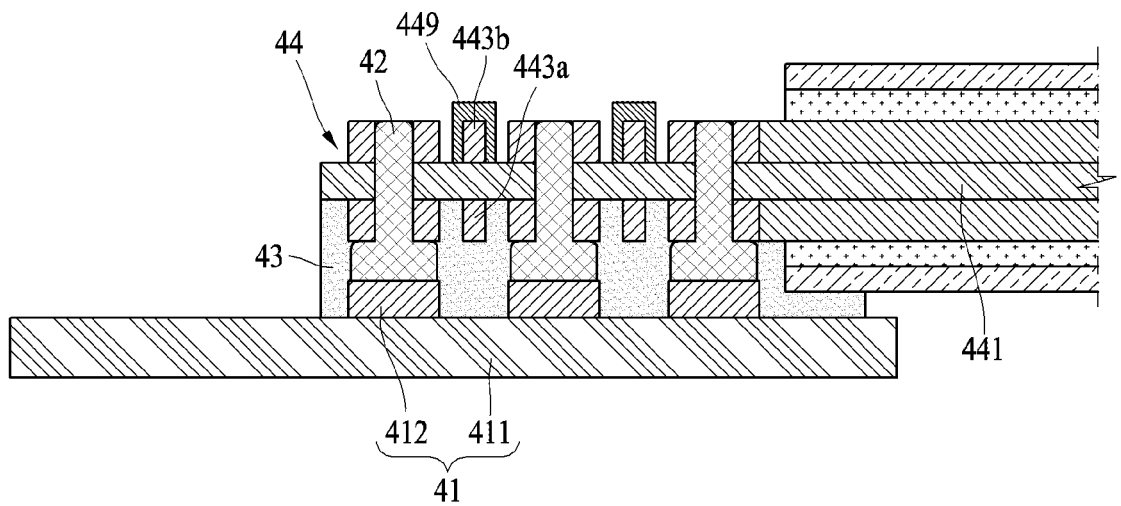
FIG. 4 is a cross-sectional view of an electronic device according to various embodiments.

FIG. 4 is a cross-sectional view of an electronic device according to various embodiments.

Referring to FIG. 4, the electronic device may include a base substrate 41, a solder 42, a bonding sheet 43, and a connection substrate 44. The base substrate 41 may include a base substrate body 411 and a base pad 412 for supporting the solder 42. The connection substrate 44 may include a connection substrate body 441 and a first connection line 443a and a second connection line 443b provided at opposite sides to each other based on the connection substrate body 441.

In an example embodiment, the first connection line 443a may be covered by the bonding sheet 33.

In an example embodiment, the electronic device may further include a photo solder resist 449 for covering the second connection line 443b. The electronic device may not include a separate photo solder resist 449 in a region where the bonding sheet 43 is provided and may include the separate photo solder resist 449 in a region where the bonding sheet 43 is provided.

Figure 5:
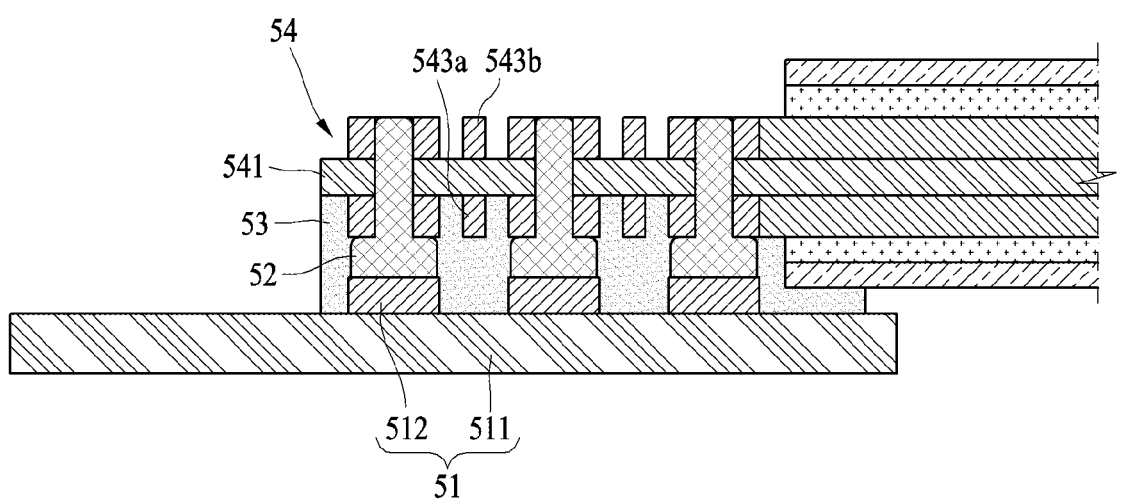
FIG. 5 is a cross-sectional view of an electronic device according to various embodiments.

FIG. 5 is a cross-sectional view of an electronic device according to various embodiments.

Referring to FIG. 5, the electronic device may include a base substrate 51, a solder 52, a bonding sheet 53, and a connection substrate 54. The base substrate 51 may include a base substrate body 511 and a base pad 512 for supporting the solder 52. The connection substrate 54 may include a connection substrate body 541 and a first connection line 543a and a second connection line 543b provided at opposite sides to each other based on the connection substrate body 541.

In an example embodiment, the first connection line 543a may be covered by the bonding sheet 33. The second connection line 543b may be exposed to the outside.

According to various example embodiments, an electronic device including a thermosetting bonding sheet may include: the base substrate including a base substrate body and a plurality of base pads disposed on the base substrate body, a connection substrate including a connection substrate body facing the base substrate body, a plurality of connection pads disposed on the connection substrate body and including a pad hole, and a plurality of connection lines disposed on the connection substrate body and respectively connected to the plurality of connection pads, a solder, at least a portion of which is inserted into the pad hole, disposed on the base pad and configured to electrically connect the base pad to the connection pad, and a thermosetting bonding sheet provided between the base substrate body and the connection substrate body, bonded to the base substrate body and the connection substrate body, and enclosing the solder.

In various example embodiments, the thermosetting bonding sheet may be attached to the base pad, the connection pad, and the solder.

In various example embodiments, the thermosetting bonding sheet may be attached to the connection line.

In various example embodiments, in a portion where the thermosetting bonding sheet is provided, the connection line may be covered by the connection substrate body and the thermosetting bonding sheet.

In various example embodiments, the thermosetting bonding sheet may fill a space between the connection pad and the connection line.

In various example embodiments, the connection substrate may include a cover layer configured to cover at least a portion of the connection substrate body and an adhesive layer configured to connect the connection substrate body to the cover layer, and the thermosetting bonding sheet may be configured to bond to the base substrate body and the cover layer.

In various example embodiments, the thermosetting bonding sheet may include a sheet base in a plate shape, and a plurality of sheet holes penetrating the sheet base and accommodating the base pad and the solder.

In various example embodiments, based on a state before thermal deformation of the thermosetting bonding sheet, a height of the thermosetting bonding sheet may be greater than a sum of a height of the solder and a height of the base pad.

In various example embodiments, based on a state in which the thermosetting bonding sheet is bonded to the base substrate and the connection substrate by thermal deformation, a height of the thermosetting bonding sheet may be less than a sum of a height of the solder and a height of the base pad.

In various example embodiments, based on a state before thermal deformation of the thermosetting bonding sheet, a diameter of the sheet hole may be greater than a diameter of the base pad.

In various example embodiments, some of the plurality of connection lines may be between two adjacent connection pads among the plurality of connection pads.

In various example embodiments, the connection substrate body may include a body hole communicating with the pad hole and accommodating at least a portion of the solder.

In various example embodiments, a pair of connection lines may be provided at opposite sides to each other based on the connection substrate body.

In various example embodiments, the electronic device may further include: a photo solder resist configured to cover a connection line provided at an opposite side to the thermosetting bonding sheet based on the connection substrate body.

In various example embodiments, a connection line provided at an opposite side to the thermosetting bonding sheet based on the connection substrate body may be exposed to an outside.

According to various example embodiments, an electronic device including a thermosetting bonding sheet may include: a base substrate including a base substrate body and a plurality of base pads disposed on the base substrate body, a solder disposed on the base pad, and a thermosetting bonding sheet including a sheet base arranged on the base substrate body and a plurality sheet holes penetrating the sheet base and accommodating the base pad and the solder.

In various example embodiments, a height of the thermosetting bonding sheet may be greater than a sum of a height of the solder and a height of the base pad.

In various example embodiments, a diameter of the sheet hole may be greater than a diameter of the base pad.

In various example embodiments, the thermosetting bonding sheet may be attachable to the base pad and the solder by thermal deformation.

According to various example embodiments, an electronic device including a thermosetting bonding sheet may include: a base substrate including a base substrate body and a plurality of base pads disposed on the base substrate body, a connection substrate including a connection substrate body facing the base substrate body, a plurality of connection pads disposed on the connection substrate body and including a pad hole, and a plurality of connection lines disposed on the connection substrate body and respectively connected to the plurality of connection pads, a solder, at least a portion of which is inserted into the pad hole, disposed on the base pad and configured to electrically connect the base pad to the connection pad, and a thermosetting bonding sheet provided between the base substrate body and the connection substrate body, bonded to the base substrate body and the connection substrate body, and attached to the base pad, the connection pad, the solder, and the connection line.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising a thermosetting bonding sheet, the electronic device comprising:
    a base substrate comprising a base substrate body and a plurality of base pads disposed on the base substrate body;
    a connection substrate comprising a connection substrate body facing the base substrate body, a plurality of connection pads disposed on the connection substrate body and comprising a pad hole, and a plurality of connection lines disposed on the connection substrate body and respectively connected to the plurality of connection pads;
    a solder, at least a portion of which is inserted into the pad hole, disposed on the base pad and configured to electrically connect the base pad to the connection pad; and
    a thermosetting bonding sheet provided between the base substrate body and the connection substrate body, bonded to the base substrate body and the connection substrate body, and enclosing the solder.

2. The electronic device of claim 1, wherein the thermosetting bonding sheet is attached to the base pad, the connection pad, and the solder.

3. The electronic device of claim 1, wherein the thermosetting bonding sheet is attached to the connection line.

4. The electronic device of claim 3, wherein, in a portion where the thermosetting bonding sheet is provided, the connection line is covered by the connection substrate body and the thermosetting bonding sheet.

5. The electronic device of claim 3, wherein the thermosetting bonding sheet is configured to fill a space between the connection pad and the connection line.

6. The electronic device of claim 1, wherein the connection substrate comprises: a cover layer configured to cover at least a portion of the connection substrate body and an adhesive layer configured to connect the connection substrate body to the cover layer, and
    the thermosetting bonding sheet is bonded to the base substrate body and the cover layer.

7. The electronic device of claim 1, wherein the thermosetting bonding sheet comprises:
    a sheet base in a plate shape; and
    a plurality of sheet holes penetrating the sheet base and accommodating the base pad and the solder.

8. The electronic device of claim 7, wherein, based on a state before thermal deformation of the thermosetting bonding sheet, a height of the thermosetting bonding sheet is greater than a sum of a height of the solder and a height of the base pad.

9. The electronic device of claim 7, wherein, based on a state in which the thermosetting bonding sheet is bonded to the base substrate and the connection substrate by thermal deformation, a height of the thermosetting bonding sheet is less than a sum of a height of the solder and a height of the base pad.

10. The electronic device of claim 7, wherein, based on a state before thermal deformation of the thermosetting bonding sheet, a diameter of the sheet hole is greater than a diameter of the base pad.

11. The electronic device of claim 1, wherein some of the plurality of connection lines are between two adjacent connection pads among the plurality of connection pads.

12. The electronic device of claim 1, wherein the connection substrate body comprises a body hole communicating with the pad hole and accommodating at least a portion of the solder.

13. The electronic device of claim 1, wherein a pair of connection lines are provided at opposite sides of the connection substrate body to each other.

14. The electronic device of claim 13, further comprising:
a photo solder resist configured to cover the connection line provided at an opposite side of the connection substrate body to the thermosetting bonding sheet.

15. The electronic device of claim 13, wherein the connection line provided at an opposite side of the connection substrate body to the thermosetting bonding sheet is exposed to an outside.

16. An electronic device comprising a thermosetting bonding sheet, the electronic device comprising:
a base substrate comprising a base substrate body and a plurality of base pads disposed on the base substrate body;
a solder disposed on the base pad; and
a thermosetting bonding sheet comprising a sheet base arranged on the base substrate body and a plurality sheet holes penetrating the sheet base and accommodating the base pad and the solder.

17. The electronic device of claim 16, wherein a height of the thermosetting bonding sheet is greater than a sum of a height of the solder and a height of the base pad.

18. The electronic device of claim 16, wherein a diameter of the sheet hole is greater than a diameter of the base pad.

19. The electronic device of claim 16, wherein the thermosetting bonding sheet is attachable to the base pad and the solder by thermal deformation.

20. An electronic device comprising a thermosetting bonding sheet, the electronic device comprising:
a base substrate comprising a base substrate body and a plurality of base pads disposed on the base substrate body;
a connection substrate comprising a connection substrate body facing the base substrate body, a plurality of connection pads disposed on the connection substrate body and comprising a pad hole, and a plurality of connection lines disposed on the connection substrate body and respectively connected to the plurality of connection pads;
a solder, at least a portion of which is inserted into the pad hole, disposed on the base pad and configured to electrically connect the base pad to the connection pad; and
a thermosetting bonding sheet provided between the base substrate body and the connection substrate body, bonded to the base substrate body and the connection substrate body, and attached to the base pad, the connection pad, the solder, and the connection line.

* * * * *